United States Patent
Tanaka et al.

(10) Patent No.: US 8,804,348 B2
(45) Date of Patent: Aug. 12, 2014

(54) FLEXIBLE PRINTED CIRCUIT BOARD AND ELECTRONIC DEVICE

(75) Inventors: Shintaro Tanaka, Osaka (JP); Tetsuya Esaki, Osaki (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/272,758

(22) Filed: Oct. 13, 2011

(65) Prior Publication Data

US 2012/0092837 A1    Apr. 19, 2012

(30) Foreign Application Priority Data

Oct. 14, 2010   (JP) ................................. 2010-231662

(51) Int. Cl.
*H05K 1/00* (2006.01)

(52) U.S. Cl.
USPC ............................ 361/749; 174/254; 174/268

(58) Field of Classification Search
USPC ................................... 361/749; 174/268, 254
See application file for complete search history.

(56) References Cited

U.S. PATENT DOCUMENTS

| 2008/0023217 A1* | 1/2008 | Hagiwara ...................... 174/254 |
| 2009/0196129 A1* | 8/2009 | Suzuki et al. ................... 369/19 |
| 2010/0073887 A1* | 3/2010 | Takeguchi et al. ............ 361/749 |

FOREIGN PATENT DOCUMENTS

| JP | 60-035412 | 2/1985 |
| JP | 4-273495 | 9/1992 |
| JP | 2010-73669 | 4/2010 |

* cited by examiner

*Primary Examiner* — Andargie M Aychillhum
(74) *Attorney, Agent, or Firm* — Hamre, Schumann, Mueller & Larson, P.C.

(57) ABSTRACT

A flexible printed circuit board can prevent itself from breaking without losing its flexibility, avoid significantly damaging the operation of an electronic device in the event that a part of the flexible printed circuit board is broken, and warn the user about the occurrence of a breakage. The flexible printed circuit board includes: a connecting portion that is formed at an end of a signal wire for transmitting an electric signal; a signal wiring portion in which a plurality of unidirectionally aligned signal wires are disposed in a vicinity of the connecting portion; a breakage detection portion in which the signal wires are not disposed and that is formed at one of side edges of the signal wiring portion; and a through hole formed between the breakage detection portion and the signal wiring portion.

6 Claims, 10 Drawing Sheets

FLEXIBLE PRINTED CIRCUIT BOARD AND ELECTRONIC DEVICE

BACKGROUND OF THE INVENTION

1. Field of the Invention

The present invention relates to a flexible printed circuit board that is connected to a circuit substrate and a device to transmit signals, and an electronic device including such a flexible printed circuit board, and particularly to a flexible printed circuit board in which conduction failure does not occur immediately even if the flexible printed circuit board is damaged when the connected circuit substrate and device are attached to and detached from each other, and an electronic device including such a flexible printed circuit board.

2. Description of Related Art

Flexible printed circuit (FPC) boards are used to connect circuit substrates or to connect a circuit substrate and a device such as a disk drive, display panel or memory device. The flexible printed circuit boards include a laminate in which a conductor layer made of a patterned copper foil or the like is laminated on a base material made of an insulating resin such as polyimide, and can be made thinner than connecting cables. In recent years, in order to handle the increased types of signals transmitted between circuit substrates and the miniaturization of devices, multilayer flexible printed circuit boards including a plurality of conductor layers laminated with insulating layers interposed therebetween also have been widely used.

A flexible printed circuit board can include a large number of signal wires, and thus is used to connect circuit substrates fixedly mounted in the housing of an electronic device, or to connect a circuit substrate and an electronic device such as a display panel. In order to make use of the inherent properties of the flexible printed circuit board of is flexibility and capablility of changing shape, the flexible printed circuit board also is used to connect a member that is attachable to and detachable from an electronic device and a circuit substrate that is fixed in the electronic device to be connected to the member.

In the case where a flexible printed circuit board is used to connect a member that is attachable to and detachable from an electronic device and a member that is fixed in the electronic device as described above, the flexible printed circuit board is required to have a length that allows the member that is attachable to and detachable from an electronic device to be sufficiently removed from the electronic device, with an end of the flexible printed circuit board being fixed in the electronic device. On the other hand, in the case of housing a member that is attachable to and detachable from an electronic device in the electronic device, the flexible printed circuit board needs to be housed in the electronic device together with the detachable member. Accordingly, when housed in the electronic device, the flexible printed circuit board folds and is housed together with the member for being housed in the electronic device in a predetermined location of the housing.

The flexible printed circuit board whose flexibility is imparted by forming a wire pattern on a base material made of a resin film has a disadvantage in that it is easily broken when handled. In order to avoid such a disadvantage of the flexible printed circuit board, a technique has been proposed in which copper foil wires through which no signal flows are formed as a dummy pattern in a curved portion of the flexible printed circuit board that is susceptible to breakage and side edges of a portion in which signal wires are formed (JP S60-35412A).

Figure 11:
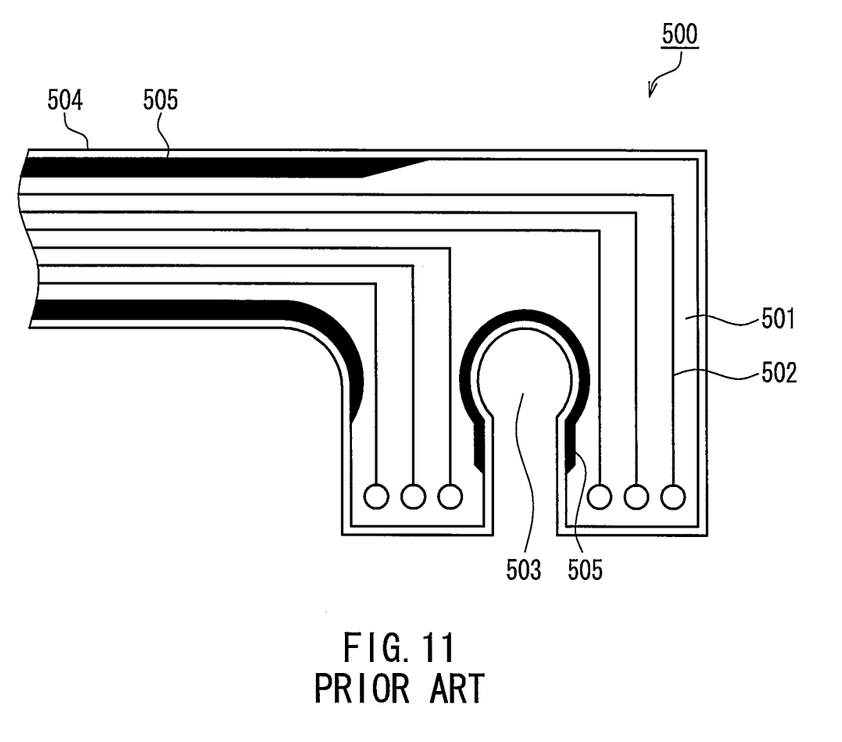
FIG. 11 is a plan view showing the configuration of a conventional flexible printed circuit board.

FIG. 11 is a plan view of a conventional flexible printed circuit board disclosed in the patent document mentioned above. A conventional flexible printed circuit board 500 shown in FIG. 11 is composed of a base material 501 made of an insulating resin and a wire pattern 502 made of a copper foil or the like formed on the base material 501. In this conventional flexible printed circuit board 500, dummy wires 505 through which no signal flows are formed in the periphery of a recessed portion 503 formed in the base material 501 and along the inner sides of side portions 504 of a narrow portion of the flexible printed circuit board 500, and aims to improve the strength of the resin base material 501 by using the dummy wires 505 made of a metal foil.

The technique described in the patent document mentioned above is to reinforce a flexible printed circuit board by forming dummy wires made of a metal foil in locations susceptible to breakage, but the copper foil or the like forming the wire pattern is a thin film formed on the resin base material, and it is thus difficult to sufficiently improve the strength of the entire flexible printed circuit board. On the other hand, in order to dispose a thick film member having a sufficient strength, another process is required, and, moreover, the resulting flexible printed circuit board will have increased rigidity, and therefore the property of the flexible printed circuit board that it is capable of flexibly changing shape is compromised.

Also, this technique merely reinforces locations susceptible to breakage by using a metal foil, and thus if a force sufficient to break the reinforced flexible printed circuit board is applied, disconnection or the like will occur due to the flexible printed circuit board being broken, which prevents the electronic device from operating normally, and in the worst case, may cause more severe defects such as damage or burnout of the circuit element due to overcurrent.

SUMMARY OF THE INVENTION

The present invention has been conceived to solve the problems described above, and it is an object of the present invention to provide, as a flexible printed circuit board for connecting members used in an electronic device, a flexible printed circuit board that can prevent itself from breaking without losing its flexibility, avoid significantly damaging the operation of the electronic device in the event that a part of the flexible printed circuit board is broken, and warn the user about the occurrence of a breakage, and an electronic device including such a flexible printed circuit board.

In order to solve the above-described problems, a flexible printed circuit board according to the present invention includes: a connecting portion that is formed at an end of a signal wire for transmitting an electric signal; a signal wiring portion in which a plurality of unidirectionally aligned signal wires are disposed in a vicinity of the connecting portion; a breakage detection portion in which the signal wires are not disposed and that is formed at one of side edges in a direction orthogonal to the direction of alignment of the signal wires of the signal wiring portion; and a through hole formed between the breakage detection portion and the signal wiring portion.

Also, an electronic device according to the present invention includes: a housing constituting a device main body; a circuit substrate disposed in the housing; the flexible printed circuit board according to the present invention connected to the circuit substrate; and a member for being housed in the housing that is configured to be attachable to and detachable from the device main body and that is connected at the connecting portion of the flexible printed circuit board.

The flexible printed circuit board of the present invention includes a through hole and a breakage detection portion in which signal wires are not disposed, in a side edge of a signal wiring portion that is in the vicinity of a connecting portion formed at an end of signal wires. Accordingly, when a strong external force acting to break the flexible printed circuit board is applied, the breakage detection portion breaks first. This makes it possible to prevent the portion in which the signal wires are formed from breaking, and avoid a significant influence on the operation of the electronic device.

With the electronic device of the present invention, a circuit substrate in the housing and a member that is attachable to and detachable from the electronic device are connected by the flexible printed circuit board of the present invention described above, and therefore it is possible to effectively prevent the signal wires from being cut off when housing the member in the housing.

DETAILED DESCRIPTION OF THE INVENTION

A flexible printed circuit board disclosed in the present application includes: a connecting portion that is formed at an end of a signal wire for transmitting an electric signal; a signal wiring portion in which a plurality of unidirectionally aligned signal wires are disposed in a vicinity of the connecting portion; a breakage detection portion in which the signal wires are not disposed and that is formed at one of side edges in a direction orthogonal to the direction of alignment of the signal wires of the signal wiring portion; and a through hole formed between the breakage detection portion and the signal wiring portion.

With this configuration, for example, even when an unwanted external force is applied to the flexible printed circuit board when housing in an electronic device together with a member, the breakage detection portion breaks first, and the through hole that is adjacent to the breakage detection portion enables a situation in which the breakage extends to the signal wiring portion where the signal wires are formed to be avoided. Accordingly, it is possible to prevent the signal wires from being cut off, and avoid significantly influencing the operation of the electronic device. Furthermore, by the breakage detection portion being broken, it is possible to warn the user about the fact that an unwanted force has been applied to the flexible printed circuit board when the member is housed.

In the flexible printed circuit board disclosed in the present application, it is preferable that the breakage detection portion is made of a resin material constituting the flexible printed circuit board. With this configuration, it is possible easily to produce a flexible printed circuit board including a breakage detection portion having a large difference in mechanical strength with respect to the signal wiring portion in which the signal wires are formed.

Furthermore, it is preferable that a detection line for detecting a breakage is formed in the breakage detection portion. With this configuration, it is possible to electrically detect the fact that an abnormal external force has been applied to the flexible printed circuit board.

Also, it is preferable that the connecting portion is disposed via a curved portion that is bent in a plane formed by the signal wires, and the breakage detection portion is disposed on an inner side of the curved portion. With this configuration, it is possible to dispose the breakage detection portion in a portion on the inner side of the curved portion where stress concentrates in the case where the signal wires are bent at the curved portion.

Furthermore, it is preferable that a connector terminal is formed in the connecting portion. With this configuration, the flexible printed circuit board and the member connected at the connecting portion easily can be attached to and detached from each other.

Also, an electronic device disclosed in the present application includes: a housing constituting a device main body; a circuit substrate disposed in the housing; the flexible printed circuit board according to the present invention connected to the circuit substrate; and a member for being housed in the housing that is configured to be attachable to and detachable from the device main body and that is connected at the connecting portion of the flexible printed circuit board.

With this configuration, it is possible to obtain an electronic device that effectively prevents the signal wires from being cut off when the member is housed in the housing.

Hereinafter, embodiments of the present invention disclosed in the present application will be described by illustrating, as an electronic device in which a multilayer flexible printed circuit board of the present invention disclosed in the present application is used, a notebook computer that includes a hard disk as a detachable member that is housed in a main body portion of the notebook computer, and that uses the flexible printed circuit board to connect the hard disk and a circuit substrate in the notebook computer as an example.

First Embodiment

Figure 1:
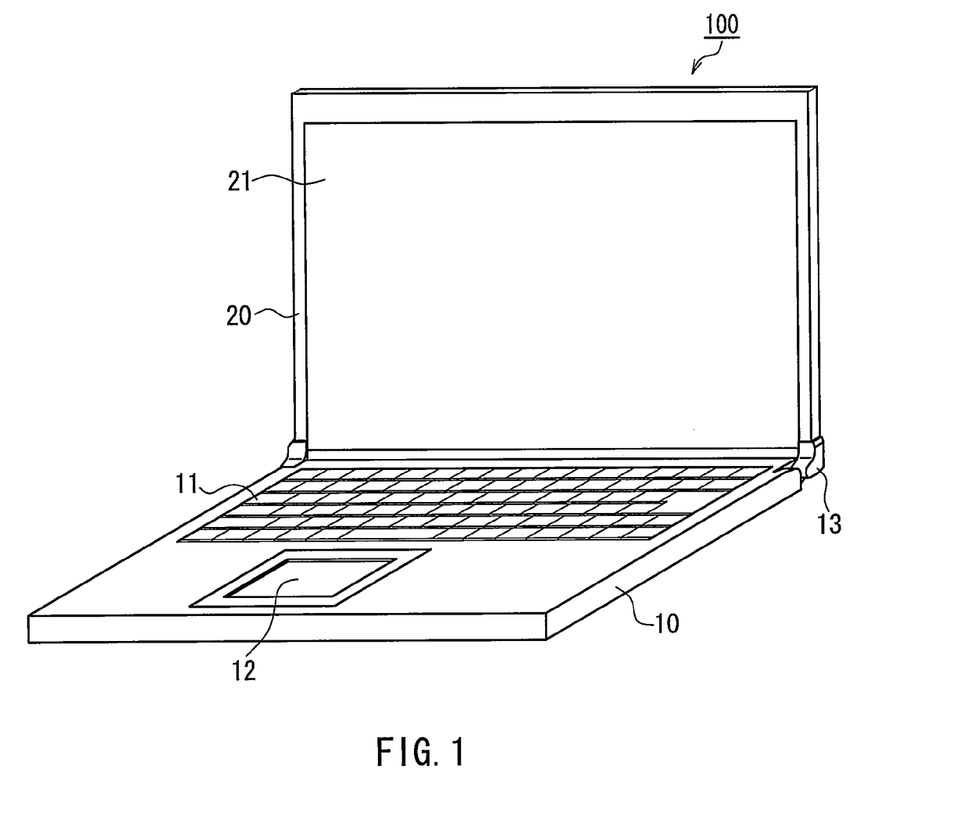
FIG. 1 is a perspective view showing the overall configuration of a notebook computer according to a first embodiment.

FIG. 1 is a perspective view showing the external appearance of a notebook computer according to a first embodiment.

As shown in FIG. 1, a notebook computer 100 of the present embodiment is constituted by a main body portion 10 and a display unit 20 provided with a display panel. The display unit 20 is rotatably attached to the main body portion 10 by a hinge mechanism 13, and thus the display unit 20 serves as a cover of the main body portion 10 when the notebook computer 100 is not in use.

As the display panel 21 used in the display unit 20, any of various types of flat panel displays such as a liquid crystal panel or an organic or inorganic EL panel can be used. A portion that becomes the upper end of the display unit 20 when the display unit 20 is opened so that the display panel 21 can be viewed is internally provided with an antenna module (not shown) for performing wireless LAN communication.

On the surface of the main body portion 10, ordinary constituent elements of a notebook computer are provided such as a keyboard 11 and a touch pad 12, as well as various types of switches, the cover of a disk drive device (not shown), and the like. Also, various types of circuit substrates on which a CPU, a memory, a power supply circuit component and the like are mounted, a rechargeable battery, various types of drive devices and the like are housed in the main body portion 10. The display unit 20 and the main body portion 10 can have the same configuration as a conventionally known notebook computer, and therefore a detailed description thereof is not given here.

Figure 2:
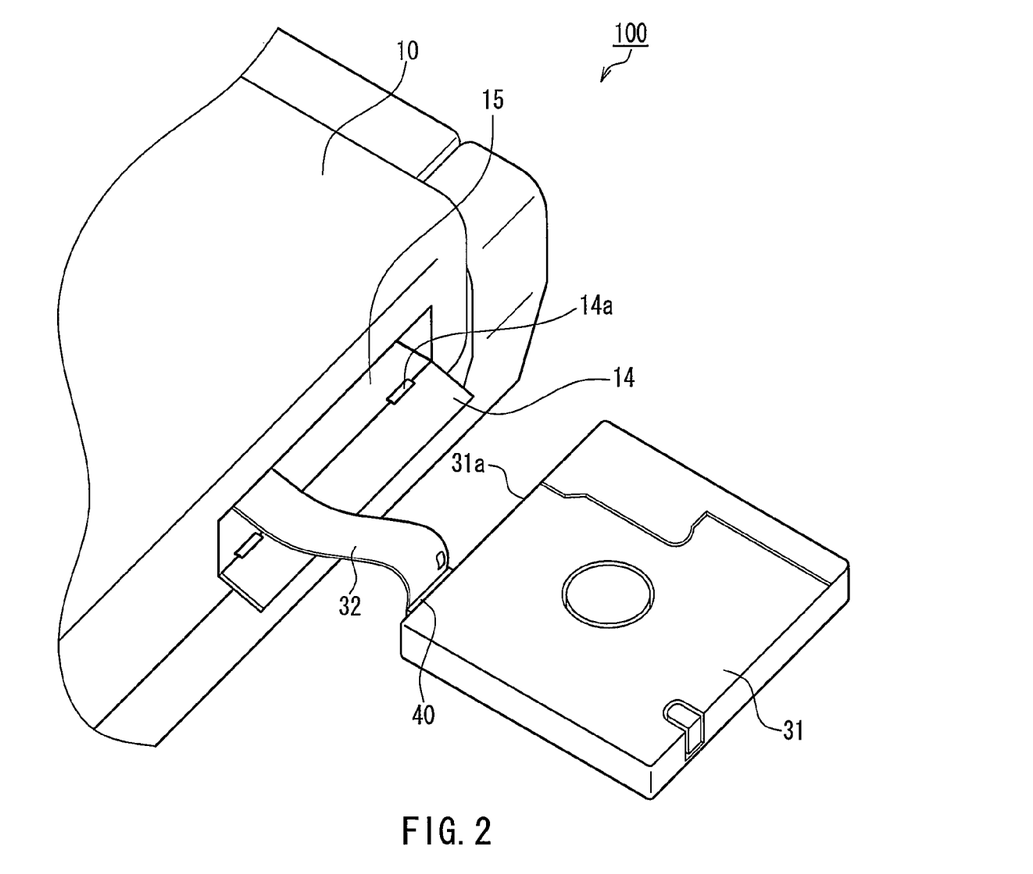
FIG. 2 is a diagram showing a state in which a detachable member is taken out of the notebook computer according to the first embodiment.

FIG. 2 is a perspective view showing the structure of a hard disk housing portion that is formed on the back side of the main body portion of the notebook computer of the present embodiment.

As shown in FIG. 2, a space 15 for housing a hard disk 31 in the main body portion 10 is provided on the back side of the main body portion 10 of the notebook computer 100 of the present embodiment. The opening of the space 15 for housing the hard disk 31 is provided with a housing cover 14 capable of opening and closing about a hinge mechanism 14a. For replacement of the hard disk 31, the user can open the housing cover 14 and take out the hard disk 31 together with a flexible printed circuit board 32 that is connected to the hard disk 31.

The flexible printed circuit board 32 has, at an end thereof, a connector terminal 40 that is connected to a terminal formed on the back side of the hard disk 31. The other end of the flexible printed circuit board 32 is connected and fixedly attached to a circuit substrate (not shown) in the main body portion 10. The user can replace the hard disk 31 by taking out the hard disk 31 together with the flexible printed circuit board 32 and thereafter detaching the connector terminal 40. Accordingly, as shown in FIG. 2, the flexible printed circuit board 32 has a length that allows the hard disk 31 to be detached from the connector terminal 40 when the flexible printed circuit board 32 has been fully removed from the main body portion.

Figure 3:
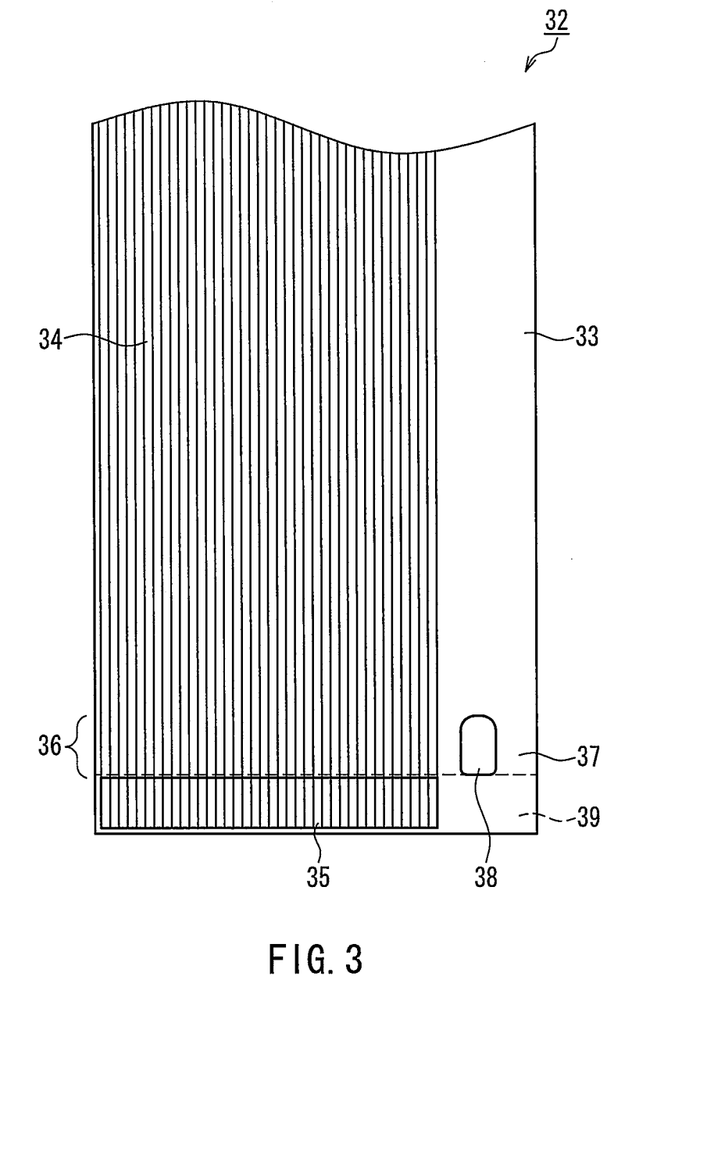
FIG. 3 is a plan view showing the shape of an end of a flexible printed circuit board used in the notebook computer according to the first embodiment.

FIG. 3 is a partially enlarged plan view showing the shape of an end of the flexible printed circuit board used in the notebook computer of the present embodiment. The end has a connecting portion for being connected to the hard disk.

As shown in FIG. 3, in the flexible printed circuit board 32 used in the notebook computer of the present embodiment, a plurality of signal wires 34 for transmitting electric signals between the hard disk 31 and a circuit substrate disposed in the main body that are formed by patterning a wiring layer such as a copper foil are formed on a base material 33 that is made of polyimide resin and has excellent flexing properties. At an end of each signal wire 34, a terminal electrode 35 serving as a connecting portion for being connected to the hard disk 31 is formed by, for example, a plating process or the like. A configuration for increasing the mechanical strength and improving slidability so as to facilitate connection to the terminal of the hard disk 31 is generally used in which, for example, a reinforcing material 39 made of highly rigid resin such as epoxy cured resin is bonded to the underside of the terminal electrodes 35. Accordingly, the vicinity of the terminal electrodes 35 has a rigidity higher than other portions of the flexible printed circuit board 32. When an external force is applied to the vicinity of the terminal electrodes 35 having such a high rigidity, the flexible printed circuit board 32 will be easily broken between the highly rigid terminal electrodes 35 and the flexible portion in which the signal wires 34 are disposed.

The arrangement pitch of the terminal electrodes 35 is defined according to the shape of the terminal of the connected hard disk 31. In the vicinity of the terminal electrodes 35, a signal wiring portion 36 in which the signal wires 34 are unidirectionally aligned is formed. In the flexible printed circuit board 32 of the present embodiment, the signal wires 34 extend linearly from the signal wiring portion 36, but in the case where the flexible printed circuit board 32 has a width different from that of a member to be connected or a terminal portion of the connected member, the signal wires 34 may be curved after passing through the signal wiring portion 36 where the signal wires 34 are unidirectionally aligned.

A breakage detection portion 37 in which the signal wires 34 are not disposed is formed at a side edge in a direction vertical to the direction of alignment of the signal wires 34 of the signal wiring portion 36, and a through hole 38 that passes through the resin base material 33 is formed between the breakage detection portion 37 and the signal wiring portion 36.

Figure 4:
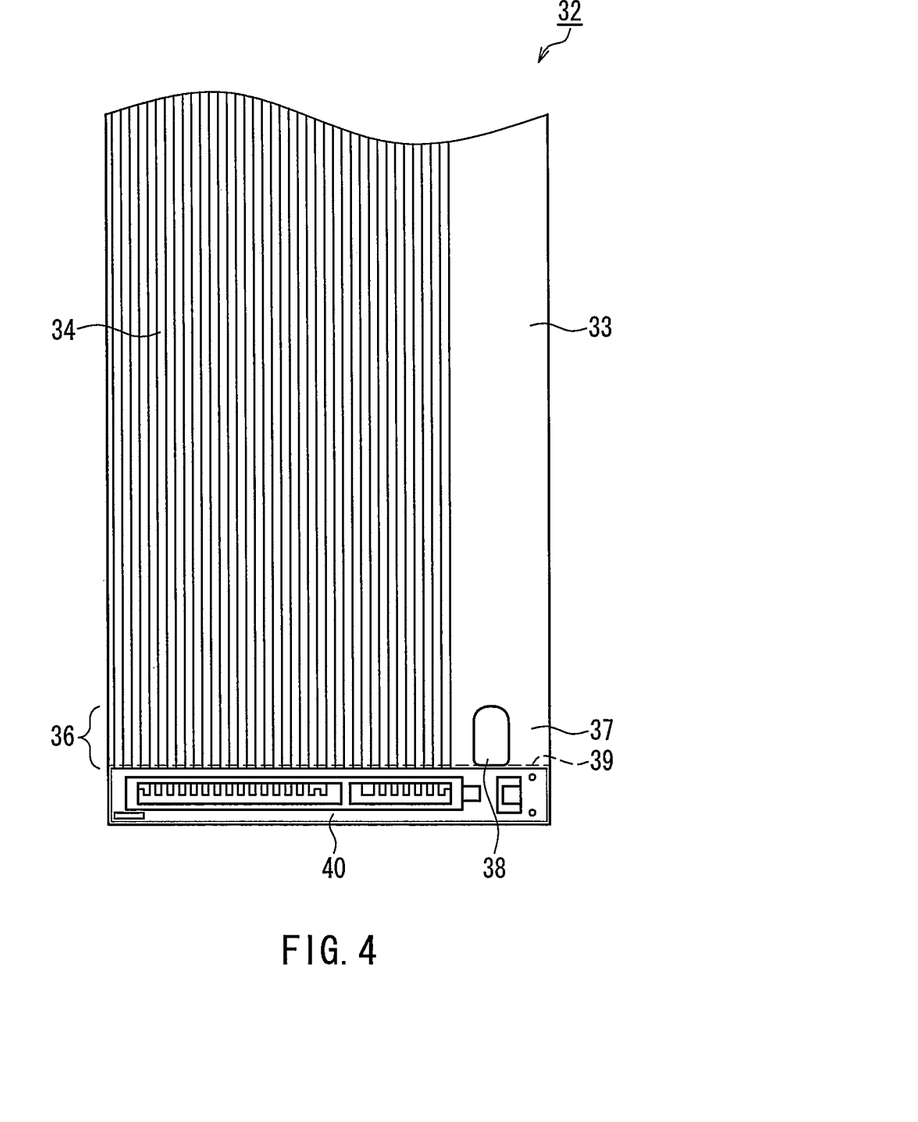
FIG. 4 is a plan view showing the shape of an end of a flexible printed circuit board used in the notebook computer according to the first embodiment.

FIG. 4 shows the vicinity of an end of a connection portion having a configuration different from that of the connection portion of the flexible printed circuit board 32 shown in FIG. 3. A connector terminal 40 is formed in the terminal electrode portion disposed at an end of the signal wires 34.

Like the hard disk 31 of the notebook computer 100 of the present embodiment, in the case where a detachable member is connected to a circuit substrate (not shown) in the main body portion 10 by using a flexible printed circuit board 32, it is often the case that a connector terminal 40 is formed in the connecting portion of the flexible printed circuit board 32, so that the detachable member and the flexible printed circuit board 32 easily can be attached to and detached from each other. The connector terminal 40 is configured to fit the connector terminal of a member to be connected, and therefore has an area larger than that in the case where the electrode terminals are formed.

The connector terminal 40 has a higher rigidity than that of the resin constituting the base material of the flexible printed circuit board 32, and therefore in the configuration shown in FIG. 4, the difference in the strength between the connector terminal 40 and the portion in which the signal wires 34 are formed is large, as compared to the configuration shown in FIG. 3 having the electrode terminals 35 as a connecting portion.

Figure 5:
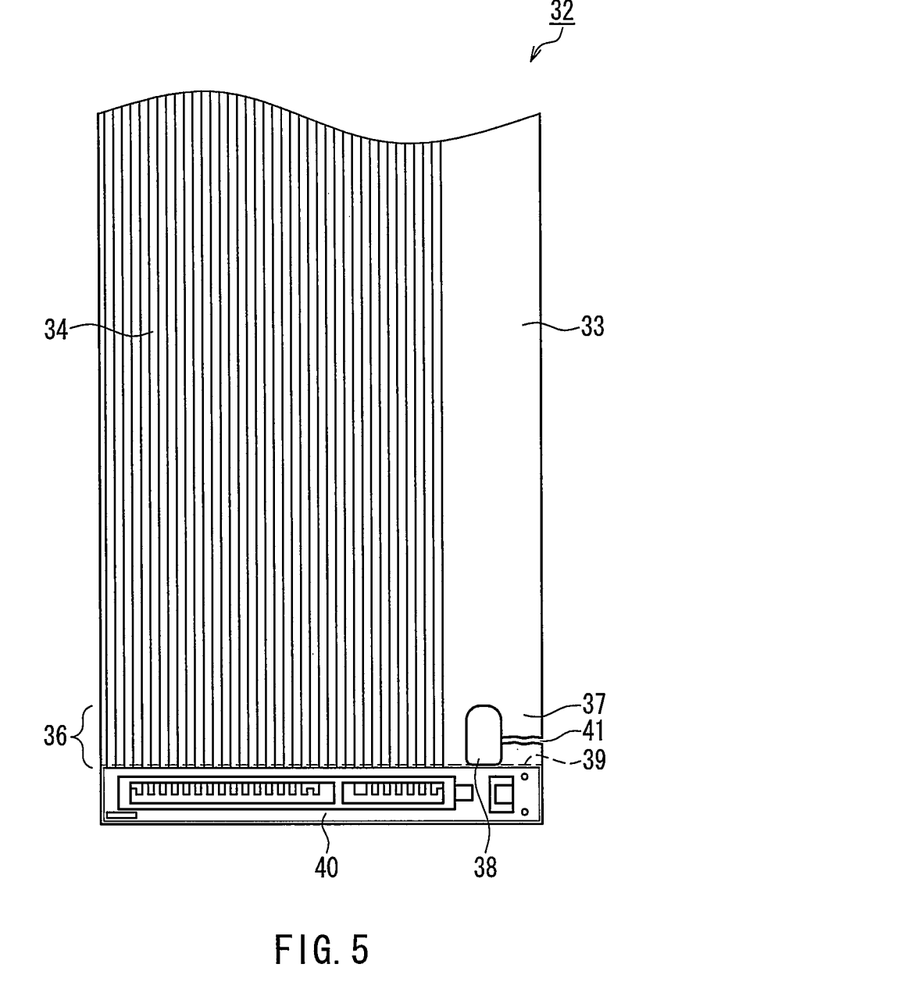
FIG. 5 is a diagram showing a state in which the flexible printed circuit board used in the notebook computer according to the first embodiment is broken.

FIG. 5 shows a state in which a break line 41 has occurred in the breakage detection portion 37 due to a large external force applied to the flexible printed circuit board 32 of the present embodiment.

The connecting portion of the flexible printed circuit board 32 is fixed to the connecting portion of an intended member that is to be connected in both the case where the terminal electrodes 35 are formed as shown in FIG. 3 and the case where the connector terminal 40 is disposed as shown in FIG. 4. Accordingly, for example, when connecting the connector terminal 40 and the hard disk 31, when housing the connected hard disk 31 in the notebook computer 100, when taking the hard disk 31 out of the notebook computer 100, or when disconnecting the connector terminal 40 and the hard disk 31, situations often arise in which an external force acting to deform the flexible printed circuit board 32 is applied. This can apply a large torsional force to the vicinity of the fixedly attached connecting portion.

Figure 7:
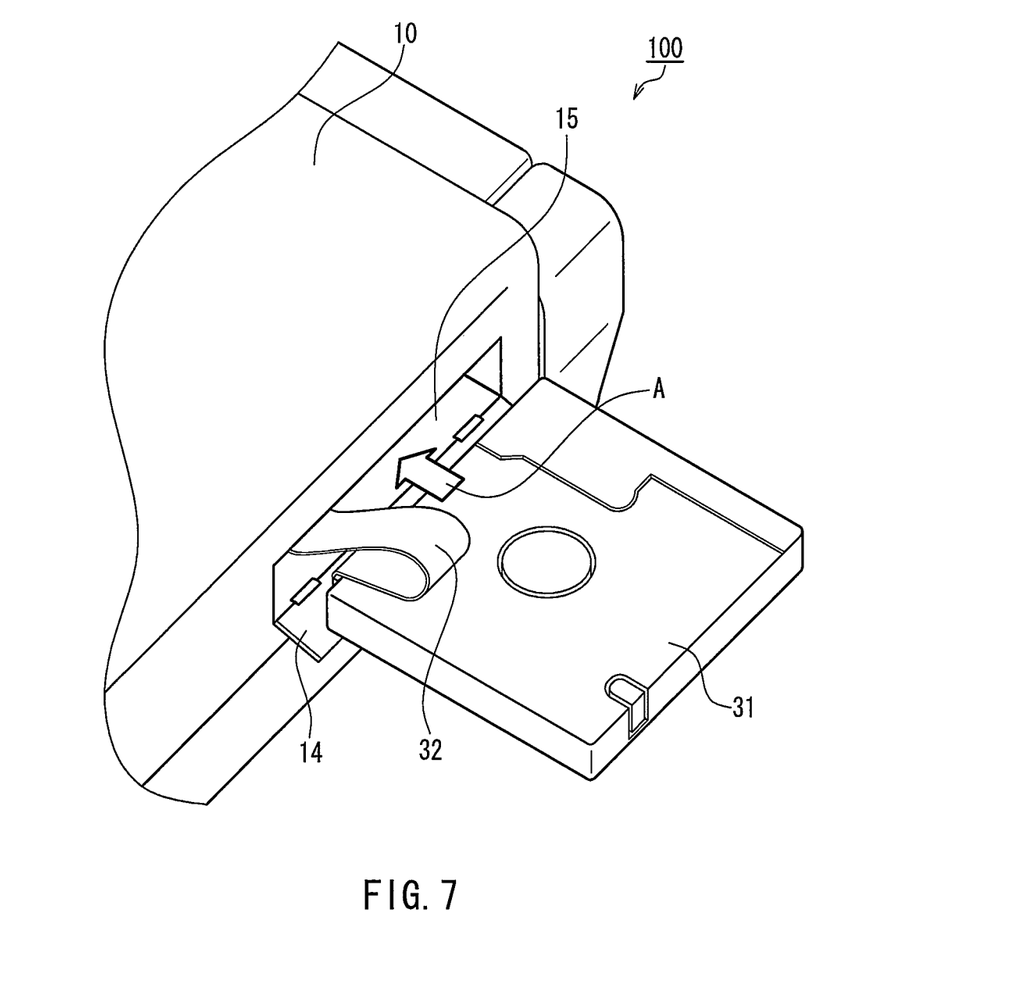
FIG. 7 is a diagram showing a state in which the detachable member is housed in the housing of the notebook computer according to the first embodiment.

As shown in FIG. 7, when housing the hard disk 31 in the space 15 of the main body portion 10, the flexible printed wiring board 32 for connecting the hard disk 31 serving as a member that is houseable in the main body portion 10, as with the notebook computer 100 of the present embodiment, folds and is pushed in a direction indicated by the arrow A in FIG. 7 together with the hard disk 31. In this case, even if the flexible printed circuit board 32 is configured to be capable of deformation to some extent, there is a high possibility that the flexible printed circuit board 32 might be deformed to a different shape each time it is housed. Furthermore, the space 15 for housing the hard disk 31 is often configured to have little leeway with respect to the shape of the hard disk 31 in order to prevent the hard disk 31 from being housed loosely. For this reason, when the hard disk 31 is housed in or taken out of the space 15, friction easily can occur between the flexible printed circuit board 32 and the inner wall of the space 15, as well as between the flexible printed circuit board 32 and the hard disk 31.

Accordingly, a stress that acts to break the flexible printed circuit board tends to be applied to the vicinity of the connecting portion of the flexible printed circuit board. As described earlier, regardless of whether the connector terminal 40 is formed as shown in FIG. 4 or the terminal electrodes 35 are formed, which was described with reference to FIG. 3, the mechanical rigidity of the connecting portion is higher than that of the portion in which the signal wires 34 are formed, and therefore when stress is applied, the flexible printed circuit board is often broken at a boundary between the connecting portion and the signal wiring portion. With the flexible printed circuit board 32 of the present embodiment, in the case where an external force acting to break the flexible printed circuit board 32 is applied, the breakage detection portion 37 where the mechanical strength is low breaks (break line 41) first, rather than the signal wiring portion 36.

Because the through hole 38 is formed between the breakage detection portion 37 and the signal wiring portion 36, the breakage generated in the breakage detection portion 37 stops at the through hole 38, and therefore the possibility that the breakage will extend to the signal wires 34 formed in the signal wiring portion 36 is reduced. Also, the stress that breaks the flexible printed circuit board 32 is released at the portion where the through hole 38 is formed, and thereby the possibility that the breakage (break line 41) will extend to the signal wiring portion 36 can be reduced.

Also, by the breakage detection portion 37 being broken or by the breakage detection portion 37 being partially broken, the user who is taking the hard disk 31 out of the notebook computer 100 can confirm, as a record, the fact that an unwanted external force was applied to the flexible printed circuit board when it was housed in or taken out of the notebook computer 100. Accordingly, the user can take measures such as taking the notebook computer 100 for repair. It is also useful to remind the user not to apply a large external force to the flexible printed circuit board 32 when housing the hard disk 31.

As the breakage detection portion 37, it is possible to use the base material 33 serving as the base of the flexible printed circuit board 32 or a protective film or the like that covers the signal wiring layer. Also, in the case where the flexible printed circuit board is a multilayer flexible printed circuit board including a plurality of conductor layers, such as signal wiring layers, and insulating layers formed between the conductor layers, it is possible to form the breakage detection portion 37 by using the resin material constituting the flexible printed circuit board 32 such as by using the insulating layer formed between each two layers. A flexible printed circuit board 32 having a breakage detection portion 37 can be produced without adding any special process by, for example, adjusting a pattern forming mask during production of the flexible printed circuit board 32, such that there is no copper foil for forming signal wires 34 present in the breakage detection portion 37. In this case, a flexible printed circuit board shown in the present embodiment can be formed very easily by simply adding a step of forming a through hole in the resin material having the breakage detection portion 37. It is also of course possible to form the breakage detection portion 37 in the flexible printed circuit board 32 separately.

Figure 6:
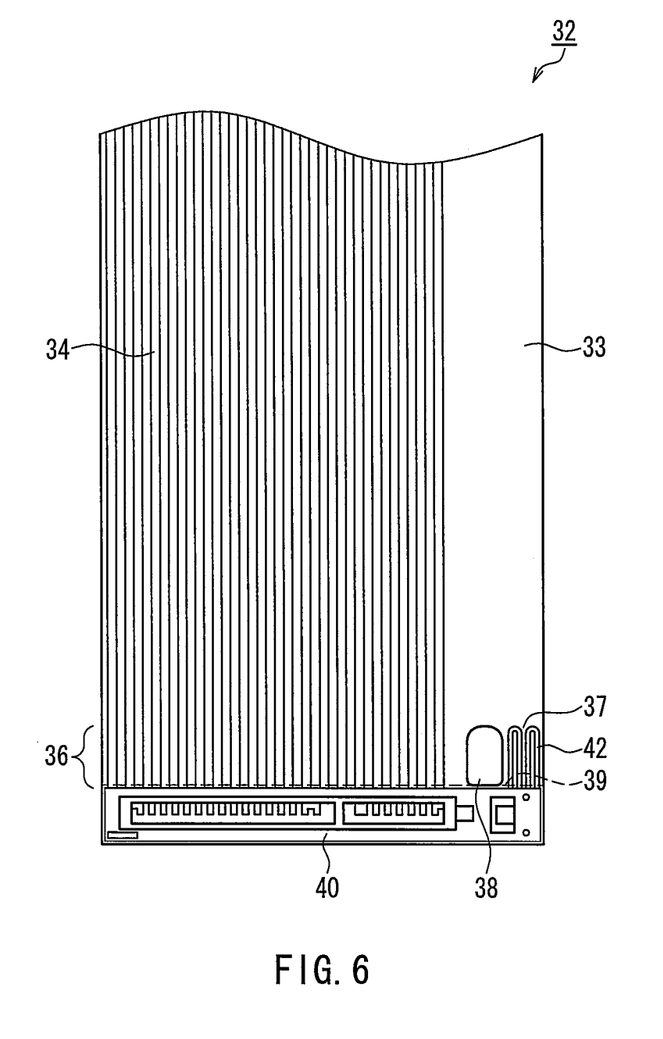
FIG. 6 is a plan view showing the shape of an application example of an end of a flexible printed circuit board used in the notebook computer according to the first embodiment.

FIG. 6 is a partially enlarged plan view showing an application example of the flexible printed circuit board according to the present embodiment.

A flexible printed circuit board 32 according to the application example shown in FIG. 6 has the same constituent elements as those of the flexible printed circuit board of the present embodiment shown in FIG. 4, except that a detection line 42 for detecting that the breakage detection portion 37 has been broken is formed in the breakage detection portion 37. Thus the same reference numerals are given to the same constituent elements, and a description thereof is omitted here.

In the flexible printed circuit board 32 of the application example shown in FIG. 6, a detection line 42 is provided in the breakage detection portion 37, and therefore if a break line 41 as shown in FIG. 5 occurs in the breakage detection portion 37, the detection line 42 is cut off. By detecting the cutoff, it is possible to warn the user or to stop the operation of the hard disk 31 or the notebook computer 100 connected by the connector terminal 40. Accordingly, the user can recognize that an unwanted stress has been applied to the flexible printed circuit board 32 without the user having to take the flexible printed circuit board 32 out of the main body portion 10 and visually check the flexible printed circuit board 32, and therefore it is possible to quickly prompt the user to undertake repairs.

Unlike the signal wires 34 that perform exchange of predetermined signals and power supply potentials between the circuit substrate in the main body portion 10 and the hard disk 31, the detection line 42 is used to check whether the breakage detection portion 37 has been broken, and therefore even if the detection line 42 is cut off, various types of signals transmitted via the flexible printed circuit board 32 and various types of power supply potentials and the like supplied to the connected member will not undesirably cease, and the normal operation of the electronic device 100 will not be influenced. The detection line 42 as described above can be formed separately in the same layer when signal wires 34 are formed by patterning. Also, in the case where the flexible printed circuit board 32 is a multilayer flexible printed circuit board including a ground layer in addition to signal wiring layers, a conductor pattern forming the ground layer can be used as the detection line 42. It is of course possible to separately form the detection line 42 in the breakage detection portion 37 at a later time.

At this time, as shown in FIG. 6, by configuring the detection line 42 to have a loop shape formed from near the connector terminal 40, which is the connecting portion, it is possible to detect, from the connector terminal 40, that the detection line 42 has been cut off. Also, as shown in FIG. 6, by forming a plurality of detection lines 42 in the breakage detection portion 37, the degree of breakage of the breakage detection portion 37 can be obtained in the form of an electric signal.

In the flexible printed circuit boards 32 shown in FIGS. 3 to 6, the wire-free region in which the signal wires 34 are not formed and which is located on the right side of the signal wires 34 in each diagram extends linearly from the portion where the breakage detection portion 37 is formed. However, the wire-free region may be reduced, or in other words, the width of the flexible printed circuit board 32 may be reduced by bringing the right side edge of the flexible printed circuit board 32 in each diagram close to the signal wires 34, whereby the flexibility of the flexible printed circuit board 32 can be increased, and the size of the flexible printed circuit board 32 when housed in the electronic device can be reduced.

Second Embodiment

Figure 8:
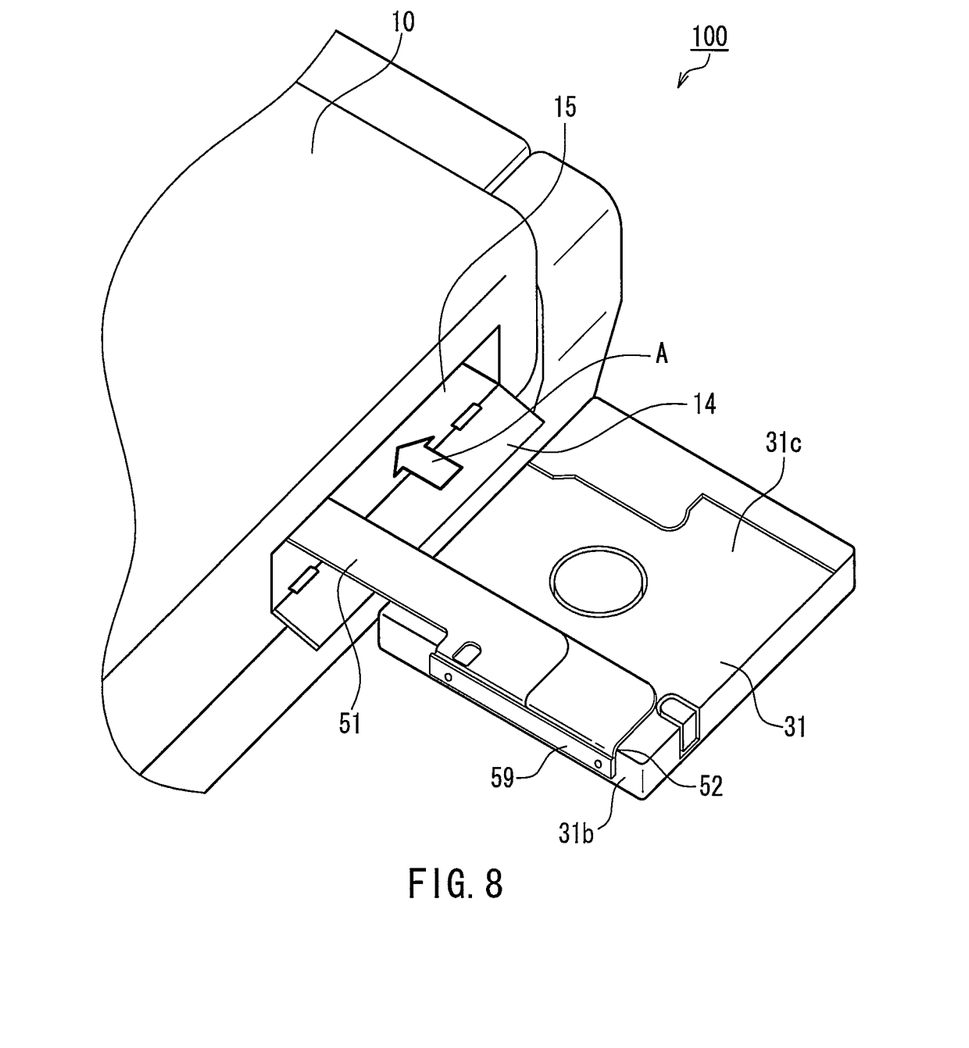
FIG. 8 is a diagram showing a state in which a detachable member is taken out of a notebook computer according to a second embodiment.

FIG. 8 is a perspective view showing a state in which a hard disk serving as a detachable member is housed in a hard disk housing portion of a notebook computer according to a second embodiment.

A notebook computer 100 according to the second embodiment shown in FIG. 8 is different from that of the first embodiment shown in FIG. 2 in that the connection terminal of a hard disk 31 is formed on a side face 31b in the direction A in which the hard disk is housed, and that the connecting portion of a flexible printed circuit board 51 is formed on a side in a lengthwise direction of the flexible printed circuit board 51. As shown in FIG. 8, the flexible printed circuit board 51 is bent at a bent portion 52 located in the vicinity of a portion in which a connector terminal 59 serving as the connecting portion is disposed such that the main surface of the flexible printed circuit board 51 in which signal wires 54 are formed extends along a back surface 31c of the hard disk 31.

Figure 9:
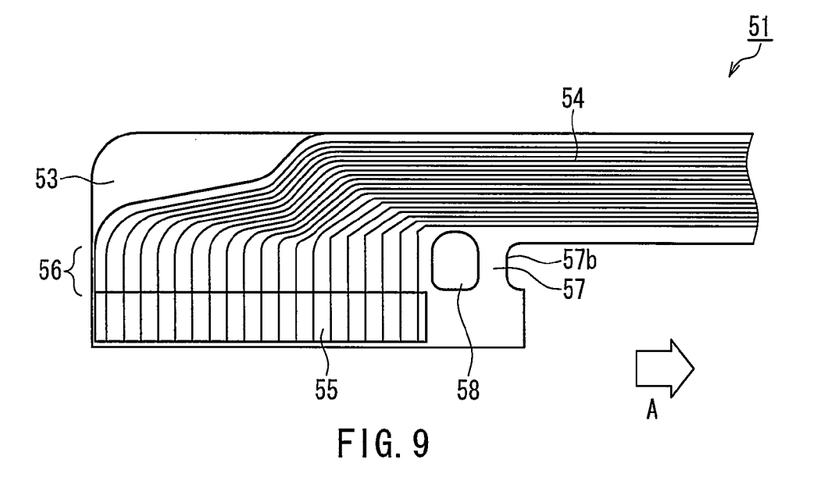
FIG. 9 is a plan view showing the shape of an end of a flexible printed circuit board used in the notebook computer according to the second embodiment.

FIG. 9 is a diagram showing the vicinity of the connecting portion of the flexible printed circuit board 51 of the second embodiment, in which terminal electrodes 55 are disposed as the connecting portion. FIG. 9 is a diagram corresponding to FIG. 3 of the first embodiment.

As shown in FIG. 9, in the flexible printed circuit board 51 of the second embodiment, the terminal electrodes 55 that serve as the connecting portion and that are formed at an end of signal wires 54 formed on a base material 53 made of polyimide resin and having excellent flexing properties form a curved portion that is bent in a direction perpendicular to the direction in which the signal wires 54 are aligned in a plane formed by the signal wires 54. In the vicinity of the terminal electrodes 55 serving as the connecting portion, the signal wires 54 are unidirectionally aligned to form a signal wiring portion 56. A breakage detection portion 57 in which the signal wires 54 are not disposed is formed at a side edge on the inner side of the curved portion of the signal wires 54, which is located in a direction vertical to the direction of alignment of the signal wires 54 of the signal wiring portion 56. A through hole 58 that passes through the resin base material 53 is formed between the breakage detection portion 57 and the signal wiring portion 56. The terminal electrodes 55 may have the same configuration as that of the terminal electrodes 35 in which a reinforcing material is disposed on the underside of the terminal electrodes, as described above with reference to FIG. 3.

Figure 10:
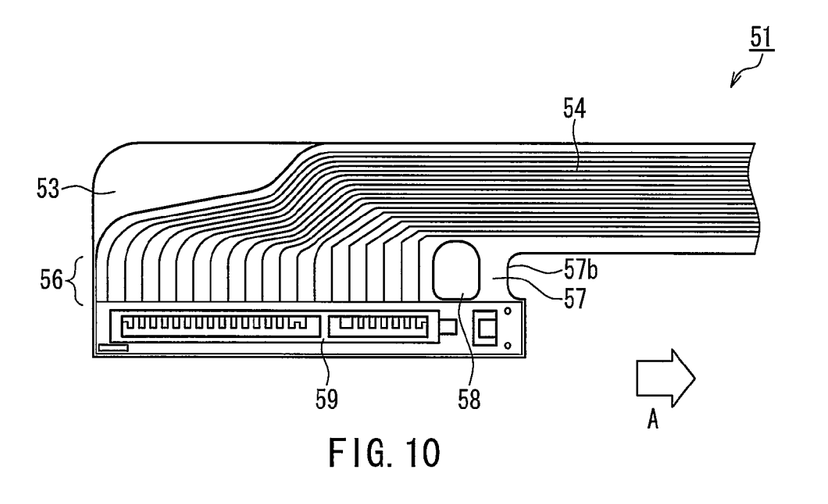
FIG. 10 is a plan view showing another shape of the end of the flexible printed circuit board used in the notebook computer according to the second embodiment.

FIG. 10 is a diagram corresponding to FIG. 4 and showing the configuration of a flexible printed circuit board according to the first embodiment, in which a connector terminal 59 is formed in the connecting portion located at an end of the signal wires 54.

In the flexible printed circuit boards 51 of the second embodiment shown in FIGS. 9 and 10 as well, a breakage detection portion 57 in which signal wires 54 are not formed and a through hole 58 are formed in the vicinity of the terminal electrodes 55 or the connector terminal 59 that serves as the connecting portion formed at an end of the signal wires 54 and that is to be fixedly attached to the connection terminal of an intended member that is to be connected. Accordingly, as with the flexible printed circuit boards 32 of the first embodiment, in the flexible printed circuit boards 51 of the second embodiment as well, if a stress in a torsional direction is applied to the flexible printed circuit board 51 or if friction occurs between the flexible printed circuit board 51 and the inner wall of the space 15 of the main body portion 10, the breakage detection portion 57 breaks first. Accordingly, it is possible to reduce the chances of the signal wires 54 being cut off as much as possible, and to warn the user about the fact that an unwanted external force has been applied to the flexible printed circuit board 51 by the breakage detection portion 57 being broken, and the fact remains as a record.

Also, as shown in FIGS. 9 and 10, by configuring a side edge 57b, of the breakage detection portion 57, located in the direction A in which it is housed in the electronic device to have a curved shape protruding toward the signal wiring portion 56, the strength of the breakage detection portion 57 can be reduced and the difference in the strength between the breakage detection portion 57 and the connecting portion can be increased.

In the flexible printed circuit boards 51 of the present embodiment as well, various types of detection lines can be provided in the breakage detection portion 57, whereby it is possible to inform the user that the breakage detection portion 57 has been broken in the form of an electric signal.

As described above, with the flexible printed circuit boards of the present embodiment, particularly if an unwanted force is applied when the flexible printed circuit board is housed in a space in the main body portion of an electronic device together with a hard disk, the fact can be conveyed to the user as a record. Also, by detecting such a breakage, the operation of the electronic device can be stopped so as not to influence the electronic device. In other words, rather than reinforcing a flexible printed circuit board to prevent it from breaking as in conventional technology, by employing the opposite idea "to use a partial breakage in a flexible printed circuit board", the location that breaks first is formed as a breakage detection portion and is used as a record, as well as protecting the electronic device. Also, by forming a through hole at a position adjacent to the breakage detection portion, when the breakage detection portion breaks, it is possible to immediately prevent the breakage from extending to the signal wires to cut off the signal wires. Furthermore, the through hole can absorb an external stress and provide the effect of avoiding a situation in which the signal wires are cut off as much as possible.

In the embodiments described above, the location in which the hard disk is housed is provided in the back side of the main body portion, but the location in which a detachable member such as a hard disk is housed may be provided in any portion of the main body portion. It is also possible to use a configuration in which the hard disk is housed in the same space as other members such as a battery.

The member that is attachable to and detachable from the main body portion and is connected to the flexible printed circuit board described in the embodiments of the present invention is of course not limited to the hard disk described in the embodiments of the present invention, and it is possible to use any member that can be removably disposed in any of various members constituting a notebook computer such as a PC card slot or disk drive for the purpose of repair, replacement or the like. Also, the electronic device is not limited to a notebook computer, and it is possible to use any electronic device that has a member that is attachable to and detachable from the main body portion of the electronic device and is connected by using a flexible printed circuit board.

Furthermore, the member to which the flexible printed circuit board is connected is not limited to a member that can be attached to and detached from the main body portion, and the flexible printed circuit board can be used as a flexible printed circuit board for connecting circuit substrates fixedly mounted in the main body portion and transmitting signals.

With the flexible printed circuit boards disclosed in the present application, when an unwanted external force is applied, the fact can be conveyed to the user by using it as a record. It is also possible to reduce the chances of severe incidents such as cutoff of signal wires occurring as much as possible. Accordingly, the flexible printed circuit boards of the present invention are useful as signal wires for connecting constituent members of an electronic device. In particular, they are useful for connection to a member that is attachable to and detachable from the main body portion, where an unwanted external force can easily be applied to the flexible printed circuit board.

Also, the electronic device including any of the flexible printed circuit boards disclosed in the present application has high operational reliability and is useful as an electronic device for various applications including portable devices and stationary devices.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A flexible printed circuit board, comprising:
    a substrate comprising a resin base material; and
    signal wires on the substrate,
    the resin base material being formed to define:
        a first segment having a first width; and
        a second segment having a second width larger than the first width,
    the signal wires extending in a first direction in the first segment and changing direction so as to extend in a second direction different from the first direction in the second segment;
    the width of the first segment and the width of the second segment being a dimension of the resin base material perpendicular to the first direction,
    the flexible printed circuit board further comprising:
    a connecting portion that is formed in the second segment at an end of the signal wires for transmitting an electric signal;
    a breakage detection portion in which the signal wires are not disposed, formed at an edge of the second segment, and at an inside of a curve defined by the change of direction of the signal wires from the first direction to the second direction; and
    a through hole formed in the second segment, between the breakage detection portion and the signal wires in the second segment,
    the connecting portion extending along a side edge of the resin base material in the second segment that extends in the first direction.

2. An electronic device comprising:
    a housing constituting a device main body;
    a circuit substrate disposed in the housing;
    the flexible printed circuit board according to claim 1 connected to the circuit substrate; and
    a member for being housed in the housing that is configured to be attachable to and detachable from the device main body and that is connected at the connecting portion of the flexible printed circuit board.

3. The electronic device of claim 2, wherein the member for being housed in the housing comprises a hard disk.

4. The flexible printed circuit board according to claim 1, wherein the substrate is made of a resin material and the breakage detection portion is made of the resin of the substrate.

5. The flexible printed circuit board according to claim 1, further comprising a detection line for detecting a breakage, formed in the breakage detection portion.

6. The flexible printed circuit board according to claim 1, further comprising a connector terminal provided in the second segment and connected to the signal wires.

* * * * *